United States Patent
Fukunaga

(10) Patent No.: US 8,963,186 B2
(45) Date of Patent: Feb. 24, 2015

(54) SEMICONDUCTOR LIGHT-EMITTING ELEMENT, LIGHT-SOURCE HEAD, AND IMAGE FORMING APPARATUS

(71) Applicant: Fuji Xerox Co., Ltd., Minato-ku, Tokyo (JP)

(72) Inventor: Hideki Fukunaga, Kanagawa (JP)

(73) Assignee: Fuji Xerox Co., Ltd., Tokyo (JP)

( * ) Notice: Subject to any disclaimer, the term of this patent is extended or adjusted under 35 U.S.C. 154(b) by 0 days.

(21) Appl. No.: 13/952,250

(22) Filed: Jul. 26, 2013

(65) Prior Publication Data

US 2014/0217442 A1  Aug. 7, 2014

(30) Foreign Application Priority Data

Feb. 4, 2013  (JP) .................. 2013-019833

(51) Int. Cl.
*H01L 33/00* (2010.01)
*G03G 15/04* (2006.01)
*H01L 33/10* (2010.01)
*H01L 33/44* (2010.01)

(52) U.S. Cl.
CPC .......... *G03G 15/04036* (2013.01); *H01L 33/10* (2013.01); *H01L 33/44* (2013.01)
USPC ............................. 257/98; 257/88

(58) Field of Classification Search
USPC ...................................... 257/98, 88
See application file for complete search history.

(56) References Cited

U.S. PATENT DOCUMENTS

2007/0036189 A1* 2/2007 Hori et al. .................. 372/50.11

FOREIGN PATENT DOCUMENTS

| JP | 10-027945 A | 1/1998 |
| JP | 2000-307155 A | 11/2000 |
| JP | 2009-070928 A | 4/2009 |
| JP | 2009-070929 A | 4/2009 |

\* cited by examiner

*Primary Examiner* — Douglas Menz
(74) *Attorney, Agent, or Firm* — Sughrue Mion, PLLC

(57) ABSTRACT

A semiconductor light-emitting element includes a semiconductor layer including a light-emitting layer, and an upper reflective surface and a lower reflective surface between which the semiconductor layer is interposed. A distance L between the upper reflective surface and the lower reflective surface satisfies $0.20\lambda + 0.5a\lambda \le L \le 0.30\lambda + 0.5a\lambda$, where $\lambda$ denotes a peak wavelength of light emitted from the light-emitting layer within the semiconductor layer, and a denotes an arbitrary positive integer.

9 Claims, 17 Drawing Sheets

FIG. 7

| LAYER | | Al COMPOSITION | THICKNESS (λ) | DOPANT |
|---|---|---|---|---|
| SiO$_2$ INSULATOR LAYER | | — | 1.25 | — |
| P-TYPE GaAs CONTACT LAYER | | 0 | 0.15 | Zn |
| P-TYPE AlGaAs CLADDING LAYER | | 0.30 | 2.1 | Zn |
| P-TYPE AlGaAs BARRIER LAYER | LIGHT-EMITTING LAYER | 0.30 | 1.25 | Zn |
| I-TYPE AlGaAs ACTIVE LAYER | | 0.14 | 1.0 | — |
| N-TYPE AlGaAs BARRIER LAYER | | 0.30 | 1.25 | Si |
| N-TYPE DBR LAYER | 10 REPEATING LAYERS | 0.90 | 0.25 | Si |
| | | 0.30 | 0.25 | Si |
| N-TYPE AlGaAs LAYER | | 0.90 | 0.25 | Si |
| N-TYPE GaAs BUFFER LAYER | | 0 | 0.24 | Si |
| N-TYPE GaAs SUBSTRATE | | 0 | — | — |

FIG. 9

| LAYER | | Al COMPOSITION | THICKNESS (λ) | DOPANT |
|---|---|---|---|---|
| SiN$_x$ INSULATOR LAYER | | — | 1.25 | — |
| P-TYPE GaAs CONTACT LAYER | | 0 | 0.15 | Zn |
| P-TYPE AlGaAs CLADDING LAYER | | 0.30 | 2.1 | Zn |
| P-TYPE AlGaAs BARRIER LAYER | LIGHT-EMITTING LAYER | 0.30 | 1.25 | Zn |
| I-TYPE AlGaAs ACTIVE LAYER | | 0.14 | 1.0 | — |
| N-TYPE AlGaAs BARRIER LAYER | | 0.30 | 1.25 | Si |
| N-TYPE DBR LAYER | 10 REPEATING LAYERS | 0.90 | 0.25 | Si |
| | | 0.30 | 0.25 | Si |
| N-TYPE AlGaAs LAYER | | 0.90 | 0.25 | Si |
| N-TYPE GaAs BUFFER LAYER | | 0 | 0.24 | Si |
| N-TYPE GaAs SUBSTRATE | | 0 | — | — |

FIG. 12

| LAYER | | Al COMPOSITION | THICKNESS (λ) | DOPANT |
|---|---|---|---|---|
| SiO$_2$ INSULATOR LAYER | | — | 1.00 | — |
| SiN$_x$ INSULATOR LAYER | | — | 0.25 | — |
| P-TYPE GaAs CONTACT LAYER | | 0 | 0.15 | Zn |
| P-TYPE AlGaAs CLADDING LAYER | | 0.30 | 2.1 | Zn |
| P-TYPE AlGaAs BARRIER LAYER | LIGHT-EMITTING LAYER | 0.30 | 1.25 | Zn |
| I-TYPE AlGaAs ACTIVE LAYER | | 0.14 | 1.0 | — |
| N-TYPE AlGaAs BARRIER LAYER | | 0.30 | 1.25 | Si |
| N-TYPE DBR LAYER | 10 REPEATING LAYERS | 0.90 | 0.25 | Si |
| | | 0.30 | 0.25 | Si |
| N-TYPE AlGaAs LAYER | | 0.90 | 0.25 | Si |
| N-TYPE GaAs BUFFER LAYER | | 0 | 0.24 | Si |
| N-TYPE GaAs SUBSTRATE | | 0 | — | — |

FIG. 14

| LAYER | | Al COMPOSITION | THICKNESS (λ) | DOPANT |
|---|---|---|---|---|
| SiN$_x$ INSULATOR LAYER | | — | 1.25 | — |
| N-TYPE GaAs CONTACT LAYER | | 0 | 0.15 | Si |
| N-TYPE AlGaAs CLADDING LAYER | | 0.30 | 2.1 | Si |
| P-TYPE AlGaAs BARRIER LAYER | | 0.30 | 1.25 | Zn |
| I-TYPE AlGaAs ACTIVE LAYER | | 0.14 | 1.0 | — |
| N-TYPE AlGaAs BARRIER LAYER | | 0.30 | 1.25 | Si |
| P-TYPE DBR LAYER | 10 REPEATING LAYERS | 0.90 | 0.25 | Zn |
| | | 0.30 | 0.25 | Zn |
| P-TYPE AlGaAs LAYER | | 0.90 | 0.25 | Zn |
| P-TYPE GaAs BUFFER LAYER | | 0 | 0.24 | Zn |
| P-TYPE GaAs SUBSTRATE | | 0 | — | — |

FIG. 16

| LAYER | | Al COMPOSITION | THICKNESS (λ) | DOPANT |
|---|---|---|---|---|
| SiN$_x$ INSULATOR LAYER | | — | 1.25 | — |
| N-TYPE GaAs CONTACT LAYER | | 0 | 0.15 | Si |
| N-TYPE AlGaAs CLADDING LAYER | | 0.30 | 1.1 | Si |
| N-TYPE AlGaAs | | 0.90 | 0.25 | Si |
| N-TYPE AlGaAs | PHASE SHIFT LAYER | 0.30 | 0.50 | Si |
| N-TYPE AlGaAs | | 0.90 | 0.25 | Si |
| P-TYPE AlGaAs BARRIER LAYER | | 0.30 | 1.25 | Zn |
| I-TYPE AlGaAs ACTIVE LAYER | | 0.14 | 1.0 | — |
| N-TYPE AlGaAs BARRIER LAYER | | 0.30 | 1.25 | Si |
| P-TYPE DBR LAYER | 10 REPEATING LAYERS | 0.90 | 0.25 | Zn |
| | | 0.30 | 0.25 | Zn |
| P-TYPE AlGaAs LAYER | | 0.90 | 0.25 | Zn |
| P-TYPE GaAs BUFFER LAYER | | 0 | 0.24 | Zn |
| P-TYPE GaAs SUBSTRATE | | 0 | — | — |

SEMICONDUCTOR LIGHT-EMITTING ELEMENT, LIGHT-SOURCE HEAD, AND IMAGE FORMING APPARATUS

CROSS-REFERENCE TO RELATED APPLICATIONS

This application is based on and claims priority under 35 USC 119 from Japanese Patent Application No. 2013-019833 filed Feb. 4, 2013.

BACKGROUND

Technical Field

The present invention relates to semiconductor light-emitting elements, light-source heads, and image forming apparatuses.

SUMMARY

According to an aspect of the invention, there is provided a semiconductor light-emitting element including a semiconductor layer, and an upper reflective surface and a lower reflective surface. The semiconductor layer includes a light-emitting layer and is interposed between the upper reflective surface and the lower reflective surface. A distance L between the upper reflective surface and the lower reflective surface satisfies $0.20\lambda + 0.5a\lambda \leq L \leq 0.30\lambda + 0.5a\lambda$, where $\lambda$ denotes a peak wavelength of light emitted from the light-emitting layer within the semiconductor layer, and a denotes an arbitrary positive integer.

BRIEF DESCRIPTION OF THE DRAWINGS

Exemplary embodiments of the present invention will be described in detail based on the following figures, wherein:

FIG. 7 illustrates the configuration of each layer included in the semiconductor light-emitting element according to the first exemplary embodiment of the present invention;

FIG. 9 illustrates the configuration of each layer included in a semiconductor light-emitting element according to a second exemplary embodiment of the present invention;

FIG. 12 illustrates the configuration of each layer included in the semiconductor light-emitting element according to the third exemplary embodiment of the present invention;

FIG. 14 illustrates the configuration of each layer included in the semiconductor light-emitting element according to the fourth exemplary embodiment of the present invention;

FIG. 16 illustrates the configuration of each layer included in the semiconductor light-emitting element according to the fifth exemplary embodiment of the present invention.

DETAILED DESCRIPTION

Figure 1:
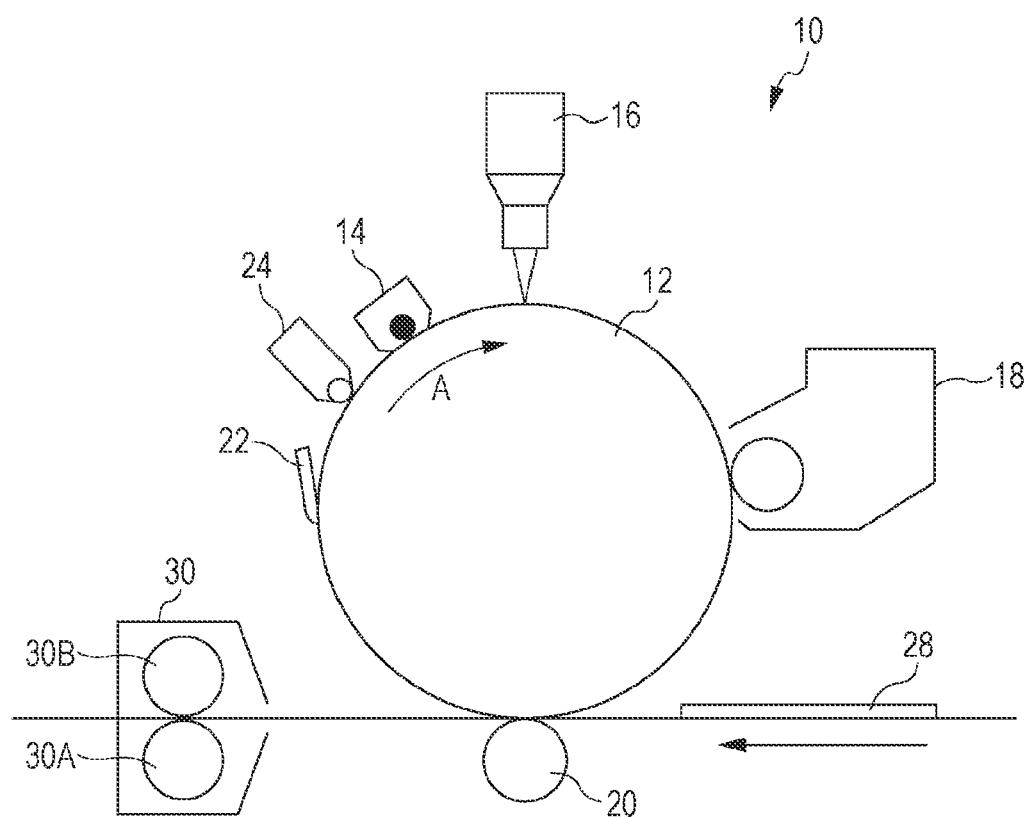
FIG. 1 illustrates the configuration of an image forming apparatus according to an exemplary embodiment of the present invention.

Exemplary embodiments of the present invention will be described below with reference to the drawings. Elements and sections that are the same among the drawings will be given the same reference numerals.

FIG. 1 illustrates the configuration of an image forming apparatus 10 according to an exemplary embodiment of the present invention. As shown in FIG. 1, the image forming apparatus 10 includes a cylindrical photoconductor 12 that rotates at a constant speed in a direction indicated by an arrow A. The photoconductor 12 is surrounded by a charging unit 14, a light-source head 16, a developing unit 18 (developing section), a transfer member 20 (transfer section), a cleaner 22, and an erase lamp 24. The charging unit 14 electrostatically charges the surface of the photoconductor 12. The light-source head 16 radiates a light beam onto the surface of the photoconductor 12 electrostatically charged by the charging unit 14 so as to form an electrostatic latent image. The developing unit 18 develops the electrostatic latent image formed on the surface of the photoconductor 12 by using a developer so as to form a toner image thereon. The transfer member 20 transfers the toner image formed on the surface of the photoconductor 12 onto a sheet 28 serving as a recording medium. The cleaner 22 removes residual toner from the surface of the photoconductor 12 after the toner image is transferred onto the sheet 28. The erase lamp 24 removes electricity from the surface of the photoconductor 12.

The surface of the photoconductor 12 having the electrostatic latent image formed thereon by being irradiated with the light beam from the light-source head 16 is supplied with toner from the developing unit 18, whereby a toner image is formed on the surface of the photoconductor 12. The transfer member 20 transfers the toner image formed on the surface of the photoconductor 12 onto the transported sheet 28. The toner remaining on the photoconductor 12 after the transfer process is removed therefrom by the cleaner 22. After the electricity is removed from the photoconductor 12 by the erase lamp 24, the photoconductor 12 is electrostatically charged again by the charging unit 14.

The sheet 28 having the toner image transferred thereon is transported to a fixing unit 30 including a pressing roller 30A and a heating roller 30B so as to undergo a fixing process. Thus, the toner image is fixed onto the sheet 28, whereby an image is formed on the sheet 28. The sheet 28 having the image formed thereon is discharged outside the image forming apparatus 10.

Figure 2:
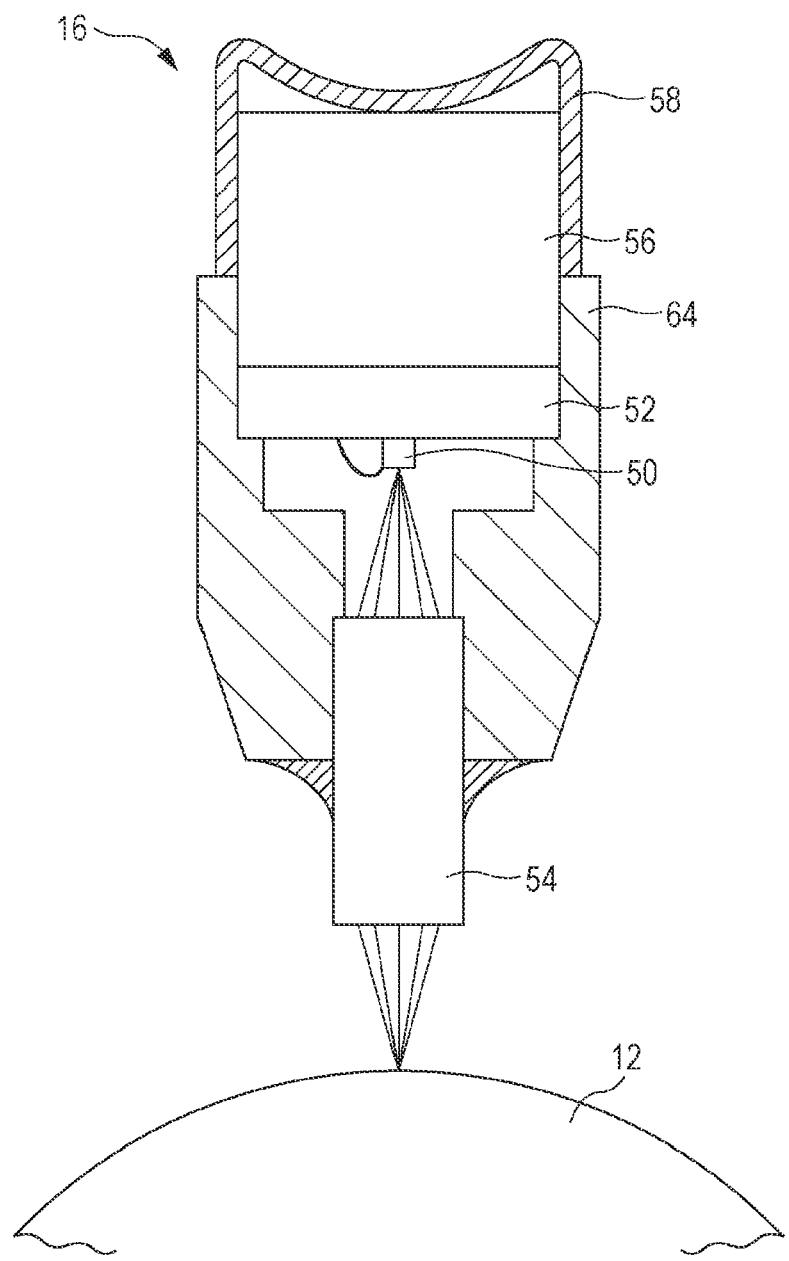
FIG. 2 is a cross-sectional view illustrating the configuration of a light-source head according to an exemplary embodiment of the present invention.

FIG. 2 is a cross-sectional view illustrating the configuration of the light-source head 16 according to an exemplary embodiment of the present invention. The light-source head 16 has self-scanning light-emitting diodes (SLEDs). As shown in FIG. 2, the light-source head 16 includes a light-emitting-element array 50, a mounting substrate 52 that supports the light-emitting-element array 50 and that has a circuit (not shown) mounted thereon for supplying various kinds of signals for controlling the driving of the light-emitting-element array 50, and a rod lens array 54, such as a Selfoc lens array ("Selfoc" is a registered trademark of Nippon Sheet Glass Co. Ltd.). The mounting substrate 52 is provided within a housing 56 such that the surface thereof that has the light-emitting-element array 50 mounted thereon faces the photoconductor 12. Moreover, the mounting substrate 52 is supported by a plate spring 58. The rod lens array 54 is supported by a holder 64 and focuses light beams emitted from semiconductor light-emitting elements 100 (see FIG. 3) constituting the light-emitting-element array 50 onto the photoconductor 12.

Figure 3:
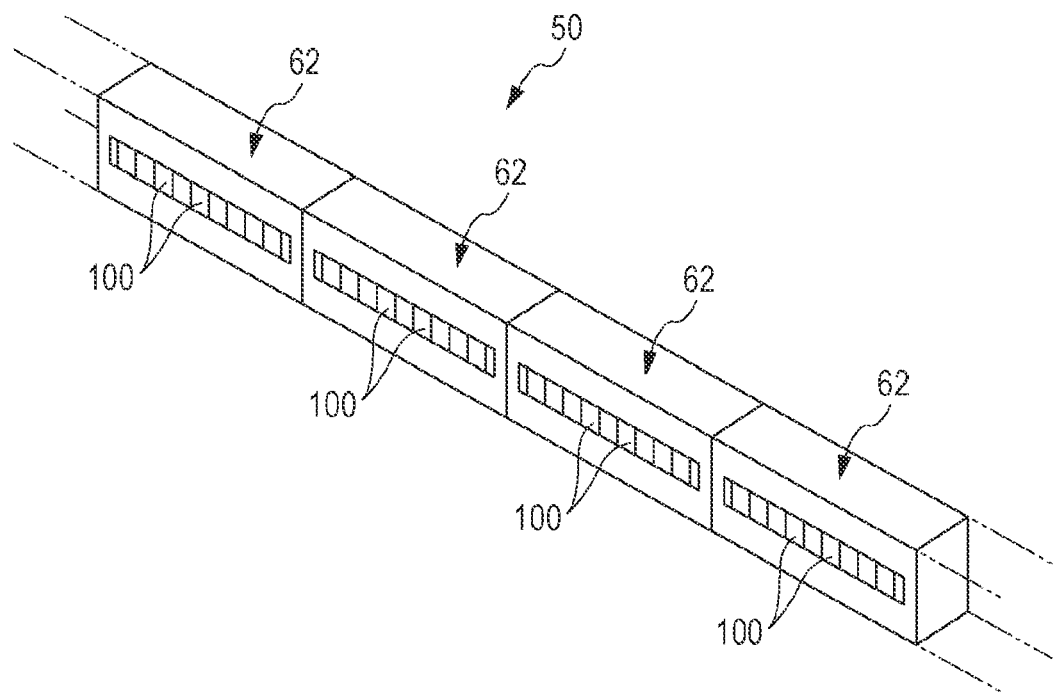
FIG. 3 is a perspective view illustrating the configuration of a light-emitting-element array according to an exemplary embodiment of the present invention.

FIG. 3 is a perspective view illustrating the configuration of the light-emitting-element array 50. The light-emitting-element array 50 includes multiple chips 62 arranged parallel to a rotational-axis direction of the photoconductor 12. Each chip 62 includes multiple semiconductor light-emitting elements 100 arranged along the rotational axis of the photoconductor 12. Although the multiple chips 62 are arranged in a single line in the example shown in FIG. 3, the multiple chips 62 may be arranged two-dimensionally in multiple lines. In that case, the multiple chips 62 may be arranged in a zigzag pattern in a direction parallel to the rotational-axis direction.

Before describing the semiconductor light-emitting elements 100 constituting the light-source head 16 according to the exemplary embodiment of the present invention in detail, semiconductor light-emitting elements according to a comparative example will be described.

Figure 4:
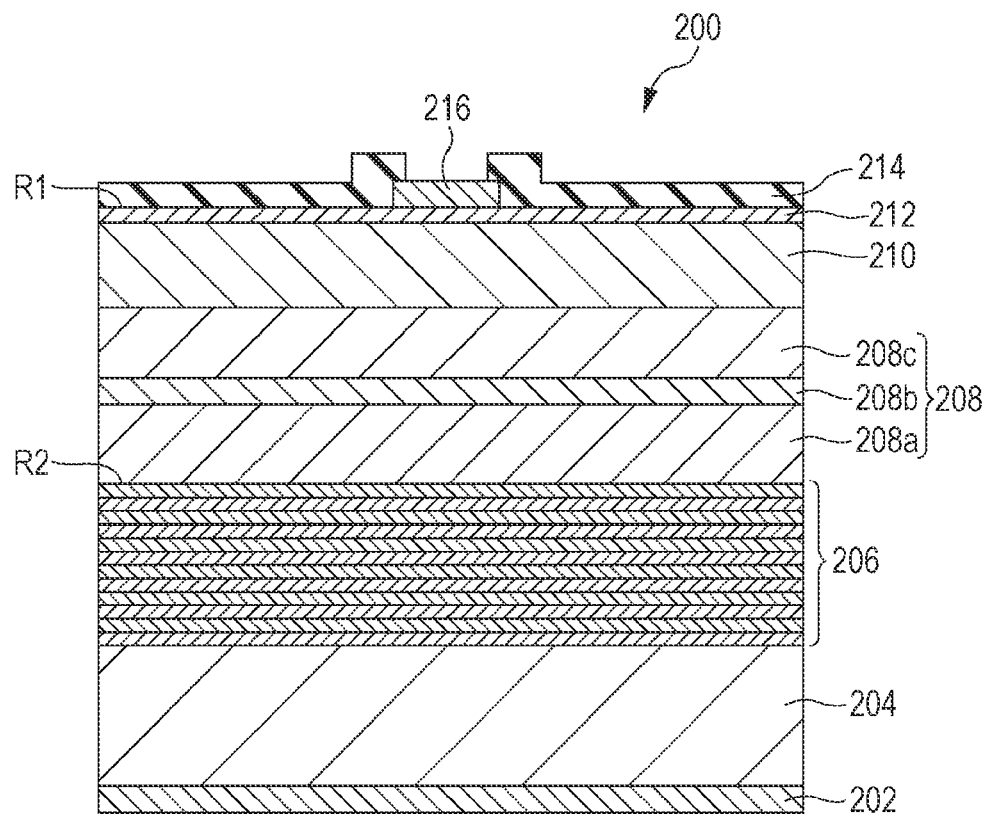
FIG. 4 is a cross-sectional view illustrating the configuration of a semiconductor light-emitting element according to a comparative example.

FIG. 4 is a cross-sectional view illustrating the configuration of a semiconductor light-emitting element 200 according to the comparative example. The semiconductor light-emitting element 200 constitutes a resonant-cavity light-emitting diode (RCLED) and has semiconductor layers including an n-type substrate 204, an n-type distributed-Bragg-reflector (DBR) layer 206, a light-emitting layer 208, a p-type cladding layer 210, and a p-type contact layer 212 that are stacked in that order from the bottom. These layers are composed of an $Al_xGa_{1-x}As$-based semiconductor material. An insulator layer 214 that functions as an antireflection layer and an upper electrode (i.e., an anode electrode) are provided on the surface of the contact layer 212. On the other hand, the surface of the substrate 204 is provided with a lower electrode (i.e., a cathode electrode) 202.

The DBR 206 is a multilayer reflector formed by alternately and repeatedly stacking two kinds of semiconductor layers both having a thickness of 0.25λ but having different refractive indices. In this case, λ is a value ($\lambda=\lambda_0/n$) obtained by dividing a peak wavelength $\lambda_0$ of light emitted from the light-emitting layer 208 in vacuum by a refractive index n of the layer. By giving the DBR 206 this configuration, a reflective surface formed at an interface between the DBR 206 and the light-emitting layer 208 achieves maximum reflectivity against light with a wavelength λ ($\lambda_0$). When an $Al_xGa_{1-x}As$-based semiconductor material is used, the refractive index of each semiconductor layer changes in accordance with the Al composition. In this comparative example, the DBR 206 is formed by alternately and repeatedly stacking low refractive-index layers composed of $Al_{0.9}Ga_{0.1}As$ and high refractive-index layers composed of $Al_{0.3}Ga_{0.7}As$.

The insulator layer 214 is composed of $SiO_2$, which is an insulating material having an intermediate refractive index between the refractive index of the semiconductor layers and the refractive index of air. The insulator layer 214 functions as an antireflection layer that reduces the reflectivity at a light extraction surface by alleviating the refractive-index difference between the semiconductor layers and the air. Thus, the light extraction efficiency in the semiconductor light-emitting element 200 is improved.

Although the insulator layer 214 functions as an antireflection layer that reduces the reflectivity at the light extraction surface, as described above, a reflective surface is formed at an interface between the insulator layer 214 and the contact layer 212 due to a refractive-index difference therebetween. In other words, the light-emitting layer 208 is disposed between an upper reflective surface R1 formed at the interface between insulator layer 214 and the contact layer 212 and a lower reflective surface R2 formed at the interface between the light-emitting layer 208 and the DBR 206, whereby a resonator is formed. In the semiconductor light-emitting element 200 according to the comparative example, a distance L between the upper reflective surface R1 and the lower reflective surface R2, which corresponds to a resonator length (i.e., the thickness of the semiconductor layers (the total thickness of the light-emitting layer 208, the cladding layer 210, and the contact layer 212) interposed between the upper reflective surface R1 and the lower reflective surface R2), is an integral multiple of 0.5λ (L=0.5aλ, where a is a positive integer). Specifically, in this comparative example, the distance L between the upper reflective surface R1 and the lower reflective surface R2 (i.e., the total thickness of the light-emitting layer 208, the cladding layer 210, and the contact layer 212) is set to 6λ. By setting the distance L between the upper reflective surface R1 and the lower reflective surface R2 in this manner, a standing wave occurs between the upper reflective surface R1 and the lower reflective surface R2 so that light with a peak wavelength $\lambda_0$ generated in the light-emitting layer 208 is amplified before it is output outside.

The light-emitting layer 208 is formed by stacking an n-type barrier layer 208a composed of Si-doped $Al_{0.3}Ga_{0.7}As$, an active layer 208b composed of non-doped $Al_{0.14}Ga_{0.86}As$, and a p-type barrier layer 208c composed of Zn-doped $Al_{0.3}Ga_{0.7}As$, and generates light with a peak wavelength of about 780 nm.

Figure 5A:
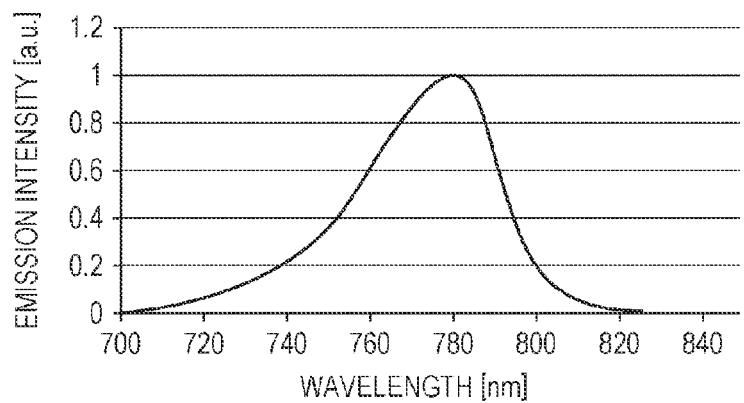
FIG. 5A illustrates a spontaneous emission spectrum of the semiconductor light-emitting element according to the comparative example.

FIG. 5A illustrates a spontaneous emission spectrum of the semiconductor light-emitting element 200 according to the comparative example. A spontaneous emission spectrum is a spectrum determined by the composition of the light-emitting layer 208. As shown in FIG. 5A, the spontaneous emission spectrum of the semiconductor light-emitting element 200 has a peak wavelength $\lambda_0$ of about 780 nm in vacuum.

Figure 5B:
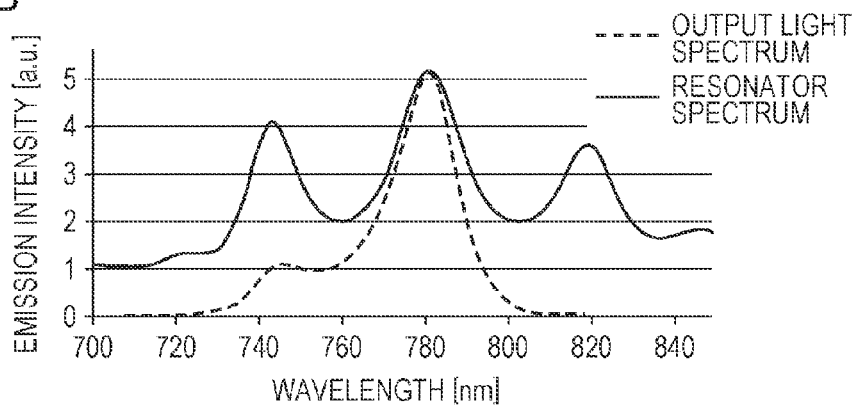
FIG. 5B illustrates a resonator spectrum and an output light spectrum of the semiconductor light-emitting element according to the comparative example.

FIG. 5B illustrates a resonator spectrum (solid line) and an output light spectrum (dashed line) of the semiconductor light-emitting element 200 according to the comparative example. A resonator spectrum corresponds to a case where white light, which is not dependent on the wavelength, is extracted outside via the resonator formed within the semiconductor light-emitting element 200. In other words, the resonator spectrum shows the wavelength selectivity (i.e., wavelength dependency of light extraction efficiency) in the resonator formed within the semiconductor light-emitting element 200.

An output light spectrum corresponds to a case where light generated in the light-emitting layer 208 is extracted outside after being amplified by the resonator formed within the semiconductor light-emitting element 200. The output light spectrum is determined by multiplying the spontaneous emission spectrum by the resonator spectrum. Therefore, if the resonator spectrum is discretely sharp, an output light spectrum that is sharper than the spontaneous emission spectrum is obtained.

As described above, in the semiconductor light-emitting element 200 according to the comparative example, the distance L between the upper reflective surface R1 and the lower reflective surface R2 is set to $6\lambda$. Therefore, as shown in FIG. 5B, a resonator spectrum having a peak in a wavelength range that is aligned with the peak wavelength $\lambda_0$ (780 nm) of the spontaneous emission spectrum is obtained. By aligning the peak wavelength of the spontaneous emission spectrum with the peak wavelength of the resonator spectrum in this manner, the amplification effect on the peak wavelength is facilitated, so that the quantity of light to be extracted outside increases.

However, in a general semiconductor-light-emitting-element manufacturing process, the crystal growth rate of each semiconductor layer varies within a wafer, causing the thickness of the semiconductor layer to be nonuniform within the wafer. Since the peak wavelength (wavelength selectivity) of the resonator spectrum changes in accordance with the thickness of the semiconductor layers (i.e., the distance between the upper reflective surface R1 and the lower reflective surface R2), if the thickness of the semiconductor layers is nonuniform, the peak wavelength (wavelength selectivity) of the resonator spectrum would vary. Specifically, if the thickness of the semiconductor layers changes in the decreasing direction, the peak wavelength of the resonator spectrum would shift toward the short wavelength side. In contrast, if the thickness of the semiconductor layers changes in the increasing direction, the peak wavelength of the resonator spectrum would shift toward the long wavelength side. In other words, although the peak wavelength of the spontaneous emission spectrum and the peak wavelength of the resonator spectrum would be aligned with each other if the thickness of the semiconductor layers is equal to a designed value, the peak wavelength of the spontaneous emission spectrum and the peak wavelength of the resonator spectrum would not be aligned with each other if the thickness of the semiconductor layers deviates from the designed value. As a result, the optical power decreases, as compared with the case where the thickness of the semiconductor layers is equal to the designed value.

Figure 5C:
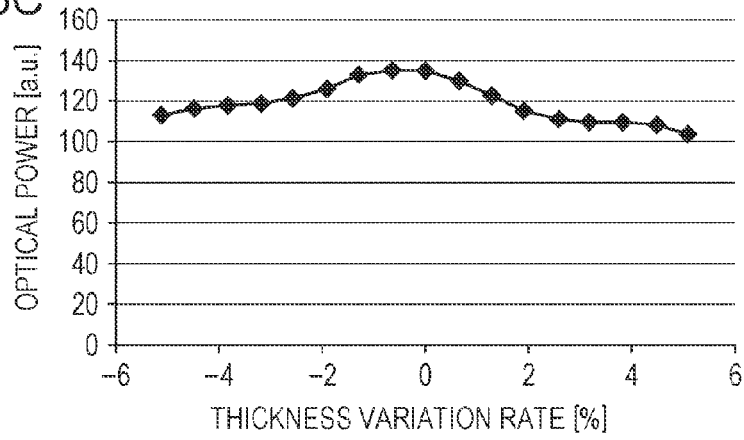
FIG. 5C illustrates the relationship between a thickness variation rate and the optical power in the semiconductor light-emitting element according to the comparative example.

FIG. 5C illustrates a simulation result showing the relationship between a thickness variation rate when the thickness of the semiconductor layers constituting the semiconductor light-emitting element 200 according to the comparative example deviates from the designed value and the quantity of light extracted outside. Specifically, in FIG. 5C, the horizontal axis denotes the variation rate from the designed value for the thickness of the semiconductor layers constituting the semiconductor light-emitting element 200, whereas the vertical axis denotes the optical power (arbitrary unit) extracted outside the semiconductor light-emitting element 200. As shown in FIG. 5C, the quantity of light output from the semiconductor light-emitting element 200 is at a maximum when the variation rate from the designed value for the thickness of the semiconductor layers is 0%. This is because, when the thickness of the semiconductor layers is equal to the designed value, the peak wavelength of the spontaneous emission spectrum and the peak wavelength of the resonator spectrum are aligned with each other. On the other hand, when the thickness of the semiconductor layers is smaller than or larger than the designed value, the optical power decreases, as compared with the case where the thickness variation rate is 0%. This is because, when the thickness of the semiconductor layers deviates from the designed value, the peak wavelength of the spontaneous emission spectrum and the peak wavelength of the resonator spectrum are displaced from each other.

Furthermore, in the semiconductor light-emitting element 200 according to the comparative example, a wavelength shift occurring in the resonator spectrum due to a change in ambient temperature (referred to as "wavelength-shift temperature dependency" hereinafter) is about 0.1 nm/° C., whereas the wavelength-shift temperature dependency of the spontaneous emission spectrum is about 0.24 nm/° C. Because the wavelength-shift temperature dependency of the resonator spectrum and the wavelength-shift temperature dependency of the spontaneous emission spectrum are different from each other, when the ambient temperature changes, the relative position between the peak wavelength of the resonator spectrum and the peak wavelength of the spontaneous emission spectrum changes. This results in a state where the optical power from two semiconductor light-emitting elements with different layer thicknesses varies in different directions in response to a change in ambient temperature. Specifically, in a semiconductor light-emitting element in which the thickness of the semiconductor layers is smaller than the designed value, the peak wavelength of the resonator spectrum is located toward the short wavelength side relative to the peak wavelength of the spontaneous emission spectrum. In this case, since the peak wavelength of the spontaneous emission spectrum shifts toward the long wavelength side when the ambient temperature increases, the displacement amount between the peak wavelength of the resonator spectrum and the peak wavelength of the spontaneous emission spectrum further increases. Therefore, the optical power decreases with increasing ambient temperature. On the other hand, in a semiconductor light-emitting element in which the thickness of the semiconductor layers is larger than the designed value, the peak wavelength of the resonator spectrum is located toward the long wavelength side relative to the peak wavelength of the spontaneous emission spectrum. In this case, since the peak wavelength of the spontaneous emission spectrum shifts toward the long wavelength side when the ambient temperature increases, the peak wavelength of the resonator spectrum and the peak wavelength of the spontaneous emission spectrum become closer to each other. Therefore, the optical power increases with increasing ambient temperature.

FIG. 5C illustrates a change in the optical power calculated by fixing the spontaneous emission spectrum and shifting the resonator spectrum toward the long wavelength side and the short wavelength side. However, this change in the optical power may also be considered as that calculated by fixing the resonator spectrum and shifting the spontaneous emission spectrum toward the long wavelength side and the short wavelength side. Therefore, a state in which the spontaneous emission spectrum has shifted toward the long wavelength side relative to the resonator spectrum in response to an increase in ambient temperature may be conceived as being equivalent to a state in which the thickness of the semiconductor layers has decreased.

For example, when the ambient temperature increases by 40° C., the spontaneous emission spectrum shifts toward the long wavelength side by about 6 nm relative to the resonator spectrum. Assuming that the spontaneous emission spectrum has a peak wavelength of 780 nm, the 6-nm shift corresponds to a thickness variation of 0.77%. Therefore, the optical power corresponding to when the thickness is reduced by 0.77% from a certain nonuniform-thickness reference point corresponds to the optical power after the ambient temperature has increased by 40° C. In other words, the differences in inclination among multiple points on the curve line shown in FIG. 5C correspond to an uneven change in the optical power relative to the temperature. Because the inclination increases at the center of the thickness variations in the structure of the semiconductor light-emitting element 200 according to the comparative example, it is assumed from the simulation result that the change in the optical power relative to a temperature change varies by a large degree.

Accordingly, in the semiconductor light-emitting element 200 according to the comparative example that is configured to align the peak wavelength of the resonator spectrum and the peak wavelength of the spontaneous emission spectrum with each other, a nonuniform thickness of the semiconductor layers within the wafer leads to an uneven output optical power and also contributes to an uneven change in the optical power relative to a change in ambient temperature.

In a case where the light-source head 16 is formed by using the light-emitting-element array 50 equipped with multiple semiconductor light-emitting elements 200, if the optical power varies from semiconductor light-emitting element to semiconductor light-emitting element, the uneven optical power may adversely affect the quality of an acquired image. One conceivable method for suppressing this uneven optical power from the semiconductor light-emitting elements 200 involves adjusting the optical power from each semiconductor light-emitting element 200 in real time. In this case, however, an additional optical power adjusting mechanism, for example, is used, thus leading to an apparatus with an increased cost, an increased size, and a complicated structure, as well as leading to lower reliability.

Semiconductor light-emitting elements according to exemplary embodiments of the present invention will be described below.

First Exemplary Embodiment

Figure 6:
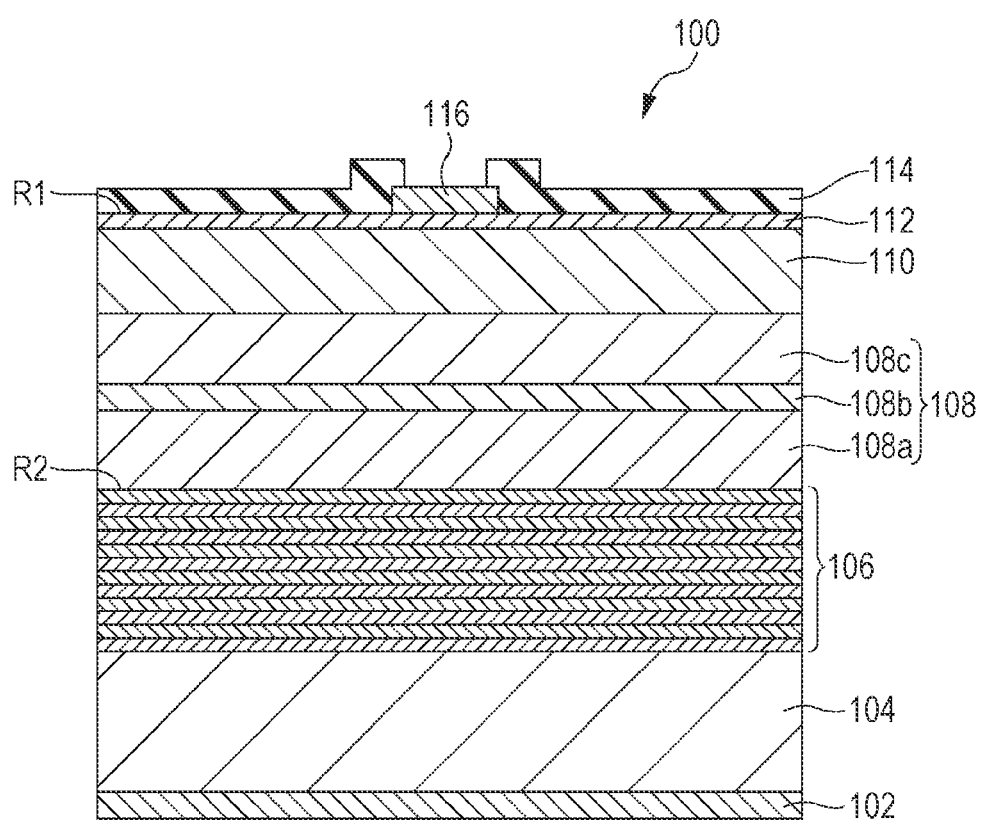
FIG. 6 is a cross-sectional view illustrating the configuration of a semiconductor light-emitting element according to a first exemplary embodiment of the present invention.

FIG. 6 is a cross-sectional view of a semiconductor light-emitting element 100 according to a first exemplary embodiment of the present invention. FIG. 7 illustrates the configuration of each layer included in the semiconductor light-emitting element 100. In FIG. 7, the Al composition ratio, the thickness, and a dopant in each of the layers constituting the semiconductor light-emitting element 100 are shown. In FIG. 7, the thicknesses are shown in multiples of a reference wavelength $\lambda$. In this case, $\lambda$ is a value ($\lambda=\lambda_0/n$) obtained by dividing a peak wavelength $\lambda_0$ (i.e., the peak wavelength of the spontaneous emission spectrum) of light emitted from a light-emitting layer in vacuum by a refractive index n of the layer (the same applies hereinafter). In other words, $\lambda$ denotes a peak wavelength when the light emitted from the light-emitting layer propagates through the layer.

The semiconductor light-emitting element 100 has an n-type substrate 104 composed of GaAs. An n-type buffer layer (not shown in FIG. 6) composed of silicon-doped GaAs is provided on the substrate 104. The buffer layer is provided for alleviating a lattice mismatch between the substrate 104 and a DBR 106 so as to improve crystallizability.

An n-type DBR 106 is provided on the buffer layer. The DBR 106 is a multilayer reflector formed by alternately and repeatedly stacking two kinds of semiconductor layers both having a thickness of 0.25$\lambda$ but having different refractive indices. Specifically, the DBR 106 is formed by alternately and repeatedly stacking low refractive-index layers composed of Si-doped $Al_{0.9}Ga_{0.1}As$ and high refractive-index layers composed of Si-doped $Al_{0.3}Ga_{0.7}As$. In the first exemplary embodiment, the total number of high refractive-index layers is 10, whereas the total number of low refractive-index layers is 11. By giving the DBR 106 this configuration, a reflective surface formed at an interface between the DBR 106 and a light-emitting layer 108 achieves maximum reflectivity against light with a wavelength $\lambda$ ($\lambda_0$).

The light-emitting layer 108 is provided on the DBR 106. The light-emitting layer 108 is formed by stacking a 1.25$\lambda$-thick n-type barrier layer 108a composed of Si-doped $Al_{0.3}Ga_{0.7}As$, a 1.00$\lambda$-thick active layer 108b composed of non-doped $Al_{0.14}Ga_{0.86}As$, and a 1.25$\lambda$-thick p-type barrier layer 108c composed of Zn-doped $Al_{0.3}Ga_{0.7}As$ in that order from the DBR 106 side. In other words, the light-emitting layer 108 has a double hetero-structure in which the active layer 108b, which has a relatively small band gap, is interposed between the n-type barrier layer 108a and the p-type barrier layer 108c, which have relatively large band gaps. By setting the Al composition of the active layer 108b in the above-described manner, the light emitted from the active layer 108b has a peak wavelength (i.e., the peak wavelength $\lambda_0$ of the spontaneous emission spectrum) of about 780 nm.

A 2.10$\lambda$-thick p-type cladding layer 110 composed of Zn-doped $Al_{0.3}Ga_{0.7}As$ is provided on the light-emitting layer 108. Furthermore, a 0.15$\lambda$-thick p-type contact layer 112 composed of Zn-doped GaAs is provided on the cladding layer 110.

A 1.25$\lambda$-thick insulator layer 114 composed of an insulating material having an intermediate refractive index between the refractive index (about 3.6) of the contact layer 112 and the refractive index (about 1.0) of air is provided on the contact layer 112. In the first exemplary embodiment, the insulator layer 114 is composed of silicon dioxide ($SiO_2$) having a refractive index of about 1.454. The insulator layer 114 functions as an antireflection layer that reduces the reflectivity at a light extraction surface by alleviating the refractive-index difference between the semiconductor layer (i.e., the contact layer 112) and the air. Thus, the light extraction efficiency in the semiconductor light-emitting element 100 is improved.

An upper electrode (i.e., an anode electrode) 116 is provided on the contact layer 112. The upper electrode 116 is composed of a material that is capable of forming an ohmic contact with the contact layer 112. Specific examples of the material include gold (Au), an alloy of gold and zinc (AuZn), and nickel (Ni). On the other hand, the surface of the substrate 104 is provided with a lower electrode (i.e., a cathode electrode) 102. The lower electrode 102 may be composed of, for example, gold (Au) or an alloy of gold and germanium (AuGe). The surface of the semiconductor light-emitting element 100 that is provided with the upper electrode 116 serves as the light extraction surface.

In the semiconductor light-emitting element 100 having the above-described configuration, a lower reflective surface R2 is formed at the interface between the light-emitting layer 108 and the DBR 106, and an upper reflective surface R1 is formed at the interface between the contact layer 112 and the insulator layer 114. In other words, the light-emitting layer 108 is located between the upper reflective surface R1 and the lower reflective surface R2, whereby a resonant-cavity light-emitting diode (RCLED) is formed.

The semiconductor light-emitting element 100 according to the first exemplary embodiment is formed such that the distance L between the upper reflective surface R1 and the lower reflective surface R2, which corresponds to a resonator length (i.e., the thickness of the semiconductor layers (the total thickness of the light-emitting layer 108, the cladding layer 110, and the contact layer 112) interposed between the upper reflective surface R1 and the lower reflective surface R2) satisfies the following expression (1):

$$L=0.25\lambda+0.5a\lambda \ (a \text{ being a positive integer}) \quad (1)$$

In other words, the distance L between the upper reflective surface R1 and the lower reflective surface R2 is set to a value that is shifted by $0.25\lambda$ from $0.5a\lambda$, which satisfies a resonant condition relative to the peak wavelength $\lambda_0$ of the spontaneous emission spectrum. In the first exemplary embodiment, the thickness of the semiconductor layers (i.e., the total thickness of the light-emitting layer 108, the cladding layer 110, and the contact layer 112) interposed between the upper reflective surface R1 and the lower reflective surface R2 is set to $5.75\lambda$ (a=11), so that the aforementioned expression (1) is satisfied.

Furthermore, in the semiconductor light-emitting element 100 according to the first exemplary embodiment, a thickness $t_i$ of the insulator layer 114 is set so as to satisfy the following expression (2):

$$t_i=0.25\lambda+0.5b\lambda \ (b \text{ being a positive integer}) \quad (2)$$

By setting the thickness $t_i$ of the insulator layer 114 in this manner, the phase of light reflected at the interface between the insulator layer 114 and the contact layer 112 becomes deviated from the phase of light reflected at the interface between the insulator layer 114 and the air by $0.5\lambda$, so that the antireflection effect by the insulator layer 114 is maximized. Furthermore, the distance between the upper surface of the insulator layer 114 and the lower reflective surface R2 (i.e., the total thickness of the light-emitting layer 108, the cladding layer 110, the contact layer 112, and the insulator layer 114) becomes an integral multiple of $0.5\lambda$, which satisfies the resonant condition relative to the wavelength $\lambda_0$. In the first exemplary embodiment, the thickness of the insulator layer 114 is set to $1.25\lambda$ (b=2), which satisfies the aforementioned expression (2).

Figure 8A:
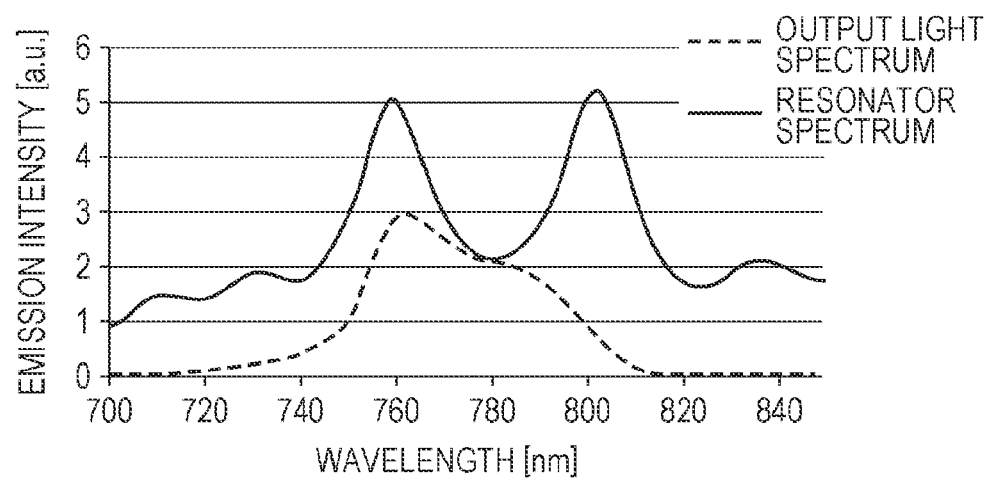
FIG. 8A illustrates a resonator spectrum and an output light spectrum of the semiconductor light-emitting element according to the first exemplary embodiment of the present invention.

FIG. 8A illustrates a resonator spectrum (solid line) and an output light spectrum (dashed line) of the semiconductor light-emitting element 100 according to the first exemplary embodiment. The spontaneous emission spectrum of the semiconductor light-emitting element 100 is the same as that from the semiconductor light-emitting element 200 according to the comparative example whose light-emitting layer has the same configuration, and has a peak wavelength $\lambda_0$ of about 780 nm (in vacuum) (see FIG. 5A).

As described above, in the semiconductor light-emitting element 100 according to the first exemplary embodiment, the distance L between the upper reflective surface R1 and the lower reflective surface R2 is set to a value that is shifted by $0.25\lambda$ from $0.5a\lambda$, which satisfies the resonant condition relative to the peak wavelength $\lambda_0$ of the spontaneous emission spectrum. Therefore, the wavelength selectivity (i.e., light extraction efficiency) relative to the peak wavelength $\lambda_0$ in the resonator formed within the semiconductor light-emitting element 100 is lower than that of the semiconductor light-emitting element 200 according to the comparative example. In other words, as shown in FIG. 8A, the peak wavelength of the resonator spectrum and the peak wavelength $\lambda_0$ ($\approx$780 nm) of the spontaneous emission spectrum are not aligned with each other. By setting the distance L between the upper reflective surface R1 and the lower reflective surface R2 such that the distance L satisfies the aforementioned expression (1), the resonator spectrum has peaks at the short wavelength side and the long wavelength side of the peak wavelength $\lambda_0$ ($\approx$780 nm) of the spontaneous emission spectrum. The reason why the resonator spectrum has two peaks in wavelength ranges that flank the peak wavelength $\lambda_0$ of the spontaneous emission spectrum is as follows. Specifically, by setting the distance L between the upper reflective surface R1 and the lower reflective surface R2 such that the distance L satisfies the aforementioned expression (1), multiple standing waves with different phases occur between the upper reflective surface R1 and the lower reflective surface R2 and may conceivably interfere with each other when the light is to be extracted outside. As described above, an output light spectrum is determined by multiplying the spontaneous emission spectrum by the resonator spectrum. In the semiconductor light-emitting element 100 according to the first exemplary embodiment, since the resonator spectrum has peaks at the short wavelength side and the long wavelength side of the peak wavelength $\lambda_0$ of the spontaneous emission spectrum, the output light spectrum has a shape that is broader than that of the semiconductor light-emitting element 200 according to the comparative example.

Figure 8B:
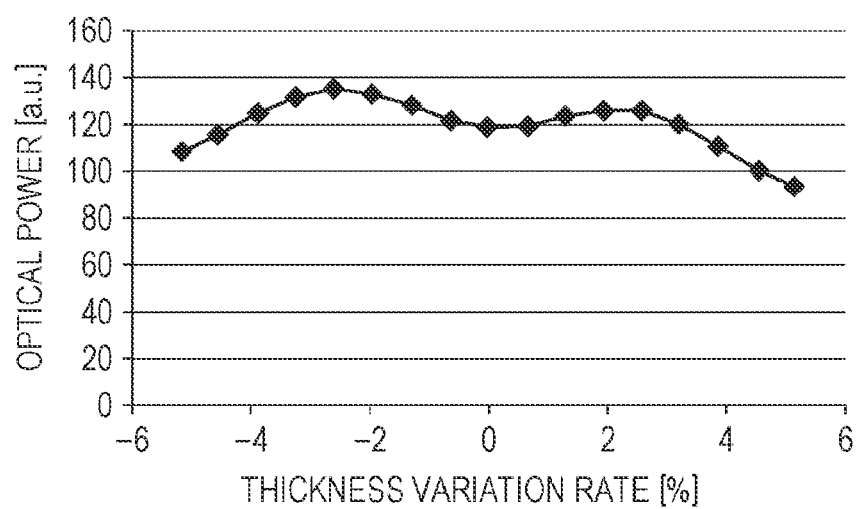
FIG. 8B illustrates the relationship between a thickness variation rate and the optical power in the semiconductor light-emitting element according to the first exemplary embodiment of the present invention.

FIG. 8B illustrates a simulation result showing the relationship between a thickness variation rate when the thickness of the semiconductor layers constituting the semiconductor light-emitting element 100 according to the first exemplary embodiment deviates from a designed value and the quantity of light extracted outside. As shown in FIG. 8B, in the semiconductor light-emitting element 100 according to the first exemplary embodiment, a change in the optical power relative to a thickness variation of the semiconductor layers is smaller than that in the semiconductor light-emitting element 200 according to the comparative example. In particular, the change in the optical power is greatly reduced within a ±2% range of the thickness variation rate of the semiconductor layers. Accordingly, by forming the peaks of the resonator spectrum at the short wavelength side and the long wavelength side of the peak wavelength $\lambda_0$ of the spontaneous emission spectrum, the change in the optical power relative to the thickness variation of the semiconductor layers is suppressed. The reason for this is as follows.

Specifically, when the thickness of the semiconductor layers changes in the increasing direction, the resonator spectrum shifts toward the long wavelength side. As a result, the peak wavelength at the short wavelength side of the resonator spectrum shifts closer toward the peak wavelength of the spontaneous emission spectrum, whereas the peak wavelength at the long wavelength side of the resonator spectrum shifts away from the peak wavelength of the spontaneous emission spectrum. Thus, the change in the optical power caused by the thickness variation of the semiconductor layers may be suppressed. On the other hand, when the thickness of the semiconductor layers changes in the decreasing direction, the resonator spectrum shifts toward the short wavelength side. As a result, the peak wavelength at the long wavelength side of the resonator spectrum shifts closer toward the peak wavelength of the spontaneous emission spectrum, whereas the peak wavelength at the short wavelength side of the resonator spectrum shifts away from the peak wavelength of the spontaneous emission spectrum. Thus, the change in the optical power caused by the thickness variation of the semiconductor layers may be suppressed.

Furthermore, with the semiconductor light-emitting element 100 according to the first exemplary embodiment, even when the peak wavelength of the spontaneous emission spectrum shifts toward the long wavelength side or the short wavelength side due to a change in the ambient temperature, the peak wavelength of the spontaneous emission spectrum shifts closer toward one of the peak wavelengths of the resonator spectrum and away from the other peak wavelength thereof. As a result, the change in the optical power relative to the change in the ambient temperature may be suppressed. Furthermore, the way the optical power changes when the thickness of the semiconductor layers is larger than the designed value and when the thickness of the semiconductor layers is smaller than the designed value is similar to the way the optical power changes relatively to the change in the ambient temperature. In other words, a nonuniform thickness of the semiconductor layers and an uneven change in the optical power relative to a change in the ambient temperature may be suppressed.

Accordingly, with the semiconductor light-emitting element 100 according to the first exemplary embodiment, a semiconductor light-emitting element is provided in which a change in the optical power relative to a thickness variation of the semiconductor layers or a change in the ambient temperature as well as an uneven change in the optical power relative to a change in the ambient temperature may be suppressed, as compared with that in the related art. Thus, by forming the light-emitting-element array 50 and the light-source head 16 by using multiple semiconductor light-emitting elements 100, a mechanism for adjusting the optical power in real time for each semiconductor light-emitting element 100 may be omitted, thus avoiding an increase in cost, an increase in size, and a complicated structure of the apparatus.

Second Exemplary Embodiment

FIG. 9 illustrates the configuration of each layer included in a semiconductor light-emitting element according to a second exemplary embodiment of the present invention. In FIG. 9, the Al composition ratio, the thickness, and a dopant in each of the layers constituting the semiconductor light-emitting element according to the second exemplary embodiment of the present invention are shown. In FIG. 9, the thicknesses are shown in multiples of a reference wavelength $\lambda$. Since the cross-sectional structure of the semiconductor light-emitting element according to the second exemplary embodiment is the same as that of the semiconductor light-emitting element 100 according to the first exemplary embodiment, the semiconductor light-emitting element according to the second exemplary embodiment will be described also with reference to FIG. 6.

In contrast to the semiconductor light-emitting element 100 according to the first exemplary embodiment in which the insulator layer 114 functioning as an antireflection layer is composed of $SiO_2$, the insulator layer 114 in the semiconductor light-emitting element according to the second exemplary embodiment is composed of silicon nitride ($SiN_x$), which has a refractive index higher than that of $SiO_2$. The refractive index of $SiN_x$ is about 1.990. Configurations other than the insulator layer 114 in the semiconductor light-emitting element according to the second exemplary embodiment are the same as those in the semiconductor light-emitting element 100 according to the first exemplary embodiment.

The semiconductor light-emitting element according to the second exemplary embodiment has the upper reflective surface R1 formed at the interface between the insulator layer 114 and the contact layer 112 and the lower reflective surface R2 formed at the interface between the DBR 106 and the light-emitting layer 108, whereby a resonant-cavity light-emitting diode (RCLED) is formed. Furthermore, the thickness of each semiconductor layer is set such that the distance L between the upper reflective surface R1 and the lower reflective surface R2 satisfies the aforementioned expression (1) (L=5.75$\lambda$), and the thickness $t_i$ of the insulator layer 114 is set so as to satisfy the aforementioned expression (2) ($t_i$=1.25$\lambda$).

Figure 10A:
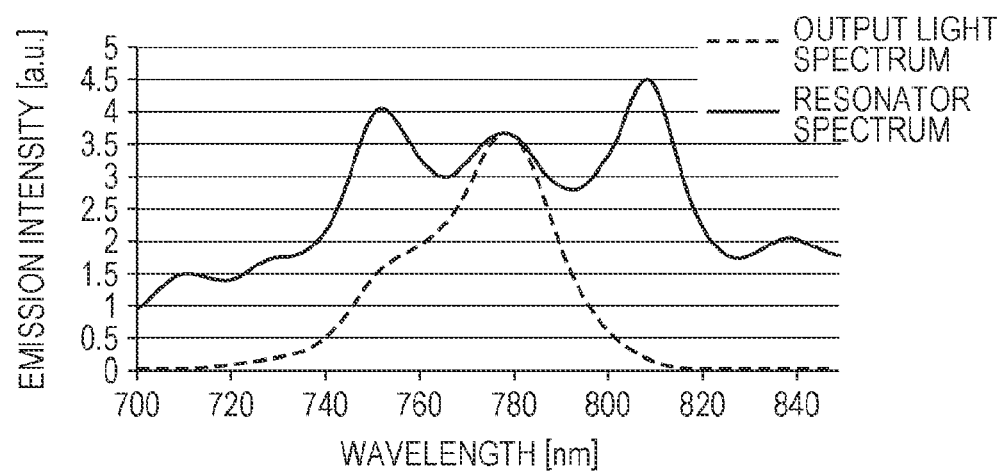
FIG. 10A illustrates a resonator spectrum and an output light spectrum of the semiconductor light-emitting element according to the second exemplary embodiment of the present invention.

FIG. 10A illustrates a resonator spectrum (solid line) and an output light spectrum (dashed line) of the semiconductor light-emitting element according to the second exemplary embodiment. A spontaneous emission spectrum of the semiconductor light-emitting element according to the second exemplary embodiment is the same as that of the semiconductor light-emitting element 200 according to the comparative example whose light-emitting layer has the same configuration, and has a peak wavelength $\lambda_0$ of about 780 nm (in vacuum) (see FIG. 5A). With the configuration of the semiconductor light-emitting element according to the second exemplary embodiment, the resonator spectrum has a peak that is located within a wavelength range aligned with the peak wavelength $\lambda_0$ ($\approx$780 nm) of the spontaneous emission spectrum and that is smaller than peaks formed at opposite sides of the wavelength range. In other words, with the insulator layer 114 being composed of $SiN_x$ having a refractive index higher than that of $SiO_2$, it is conceivable that the wavelength selectivity (i.e., light extraction efficiency) relative to the wavelength $\lambda_0$ ($\approx$780 nm) may be improved, as compared with that of the semiconductor light-emitting element 100 according to the first exemplary embodiment. As a result, the resonator spectrum obtained is flatter than those of the semiconductor light-emitting elements according to the comparative example and the first exemplary embodiment.

Accordingly, by using a material having a high refractive index for the insulator layer 114, the resonator spectrum has a peak within the wavelength range aligned with the peak wavelength $\lambda_0$ of the spontaneous emission spectrum. The reason for this is as follows. Specifically, when the refractive index of the insulator layer 114 increases, the refractive-index difference between the insulator layer 114 and the semiconductor layer (i.e., the contact layer 112) decreases, whereas the refractive-index difference between the insulator layer 114 and the air increases. Thus, the reflectivity at the interface between the insulator layer 114 and the air increases, so that a new resonator is formed in which the upper surface of the insulator layer 114 serves as an upper reflective surface and the interface between the DBR 106 and the light-emitting layer 108 serves as a lower reflective surface. In the second exemplary embodiment, the distance between the upper reflective surface and the lower reflective surface of this resonator (i.e., the total thickness of the light-emitting layer 108, the cladding layer 110, the contact layer 112, and the insulator layer 114) is set to 7$\lambda$, which satisfies the resonant condition relative to the peak wavelength $\lambda_0$, so that the wavelength selectivity (i.e., light extraction efficiency) relative to the wavelength $\lambda_0$ may be enhanced in the aforementioned resonator.

Figure 10B:
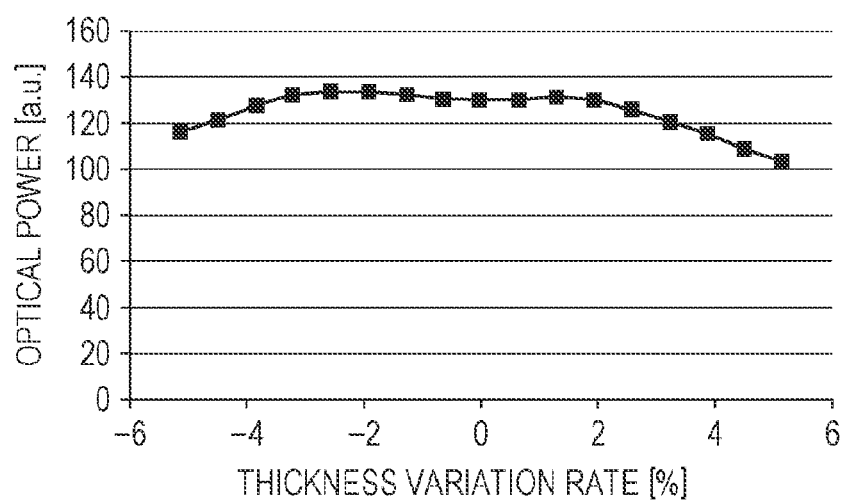
FIG. 10B illustrates the relationship between a thickness variation rate and the optical power in the semiconductor light-emitting element according to the second exemplary embodiment of the present invention.

FIG. 10B illustrates a simulation result showing the relationship between a thickness variation rate when the thickness of the semiconductor layers constituting the semiconductor light-emitting element according to the second exemplary embodiment deviates from a designed value and the quantity of light extracted outside. Because the resonator spectrum obtained by the semiconductor light-emitting element according to the second exemplary embodiment is flatter than those of the semiconductor light-emitting elements according to the comparative example and the first exemplary embodiment, a change in the optical power relative to a thickness variation of the semiconductor layers is smaller than those in the semiconductor light-emitting elements according to the comparative example and the first exemplary embodiment.

Furthermore, with the semiconductor light-emitting element according to the second exemplary embodiment, even when the peak wavelength of the spontaneous emission spectrum shifts toward the long wavelength side or the short wavelength side due to a change in the ambient temperature, the peak wavelength of the spontaneous emission spectrum shifts closer toward one of the peak wavelengths of the resonator spectrum and away from another peak wavelength of the resonator spectrum. As a result, the change in the optical power relative to the change in the ambient temperature may be suppressed. Furthermore, the way the optical power changes when the thickness of the semiconductor layers is larger than the designed value and when the thickness of the semiconductor layers is smaller than the designed value is similar to the way the optical power changes relatively to the change in the ambient temperature. In other words, an uneven change in the optical power relative to a change in the ambient temperature, caused by a nonuniform thickness of the semiconductor layers, may be suppressed. Accordingly, in the light-emitting-element array 50 or the light-source head 16 equipped with multiple semiconductor light-emitting elements according to the second exemplary embodiment, a mechanism for adjusting the optical power in real time for each semiconductor light-emitting element may be omitted, thus avoiding an increase in cost, an increase in size, and a complicated structure of the apparatus.

Third Exemplary Embodiment

Figure 11:
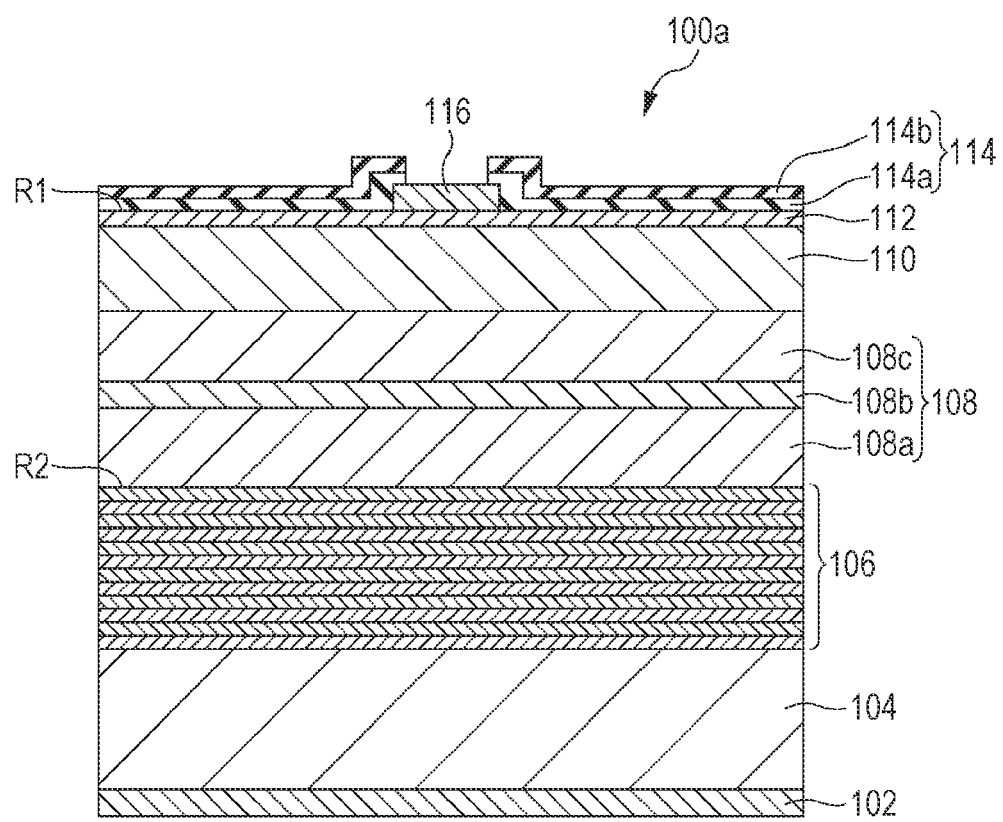
FIG. 11 is a cross-sectional view illustrating the configuration of a semiconductor light-emitting element according to a third exemplary embodiment of the present invention.

FIG. 11 is a cross-sectional view of a semiconductor light-emitting element 100*a* according to a third exemplary embodiment of the present invention. FIG. 12 illustrates the configuration of each layer included in the semiconductor light-emitting element 100*a*. In FIG. 12, the Al composition ratio, the thickness, and a dopant in each of the layers constituting the semiconductor light-emitting element 100*a* are shown. In FIG. 12, the thicknesses are shown in multiples of a reference wavelength $\lambda$.

The semiconductor light-emitting element 100*a* according to the third exemplary embodiment differs from the semiconductor light-emitting element according to each of the first and second exemplary embodiments in that the insulator layer 114 formed on the contact layer 112 is formed by stacking a first insulator layer 114*a* and a second insulator layer 114*b* that have different refractive indices. In the semiconductor light-emitting element 100*a* according to the third exemplary embodiment, configurations other than the insulator layer 114 are the same as those in the first and second exemplary embodiments described above. The first insulator layer 114*a* that is in contact with the contact layer 112 is composed of $SiN_x$, which has a relatively high refractive index (1.990). The second insulator layer 114*b* formed on the first insulator layer 114*a* is composed of $SiO_2$, which has a relatively low refractive index (1.454). The total thickness of the insulator layer 114, which is a sum of the thickness of the first insulator layer 114*a* and the thickness of the second insulator layer 114*b*, is set to $1.25\lambda$, which satisfies the aforementioned expression (2). Furthermore, in the third exemplary embodiment, the thickness of the second insulator layer 114*b* with the relatively low refractive index is larger than the thickness of the first insulator layer 114*a* with the relatively high refractive index. Specifically, the thickness of the first insulator layer 114*a* is set to $0.25\lambda$, whereas the thickness of the second insulator layer 114*b* is set to $1.00\lambda$.

The semiconductor light-emitting element 100*a* according to the third exemplary embodiment achieves optical characteristics similar to those of the semiconductor light-emitting element according to the second exemplary embodiment in which the insulator layer 114 is constituted of a single $SiN_x$ layer. In other words, with the semiconductor light-emitting element 100*a* according to the third exemplary embodiment, a semiconductor light-emitting element, a light-source head, and an image forming apparatus are provided in which a change in the optical power relative to a thickness variation of the semiconductor layers or a change in the ambient temperature as well as an uneven change in the optical power relative to a change in the ambient temperature may be suppressed, as compared with those in the related art.

Furthermore, with the semiconductor light-emitting element 100*a* according to the third exemplary embodiment, since the insulator layer 114 has a multilayer structure that includes an $SiN_x$ layer and an $SiO_2$ layer, a physical layer thickness for obtaining a desired optical thickness may be increased, as compared with a case where the insulator layer 114 is constituted of a single $SiN_x$ layer. Therefore, the pressure resisting (breakdown voltage) capability of the insulator layer 114 may be improved. Furthermore, because the insulator layer 114 has a multilayer structure that includes a high-refractive-index layer and a low-refractive-index layer, the high-refractive-index layer may be made thinner as compared with a case where the insulator layer 114 is constituted of a single high-refractive-index layer, whereby an optical adverse effect caused by an overall nonuniform thickness of the insulator layer 114 may be reduced. Moreover, with the insulator layer 114 being a multilayer structure, the degree of freedom in the process may be increased.

Fourth Exemplary Embodiment

Figure 13:
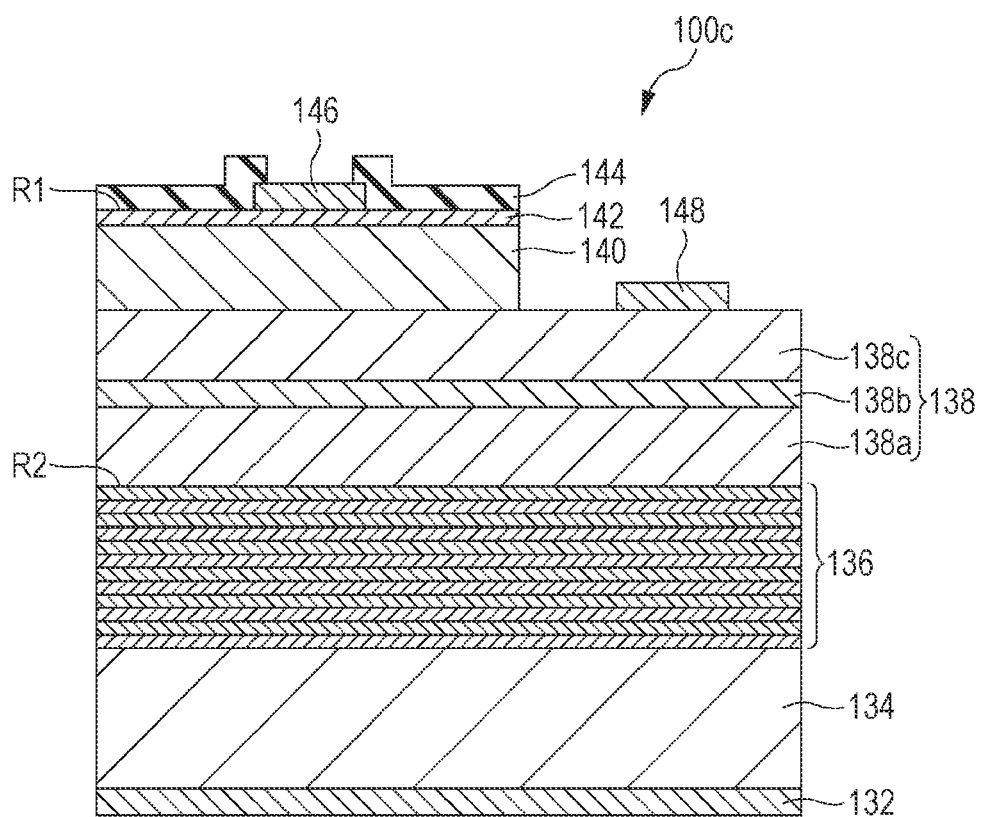
FIG. 13 is a cross-sectional view illustrating the configuration of a semiconductor light-emitting element according to a fourth exemplary embodiment of the present invention.

FIG. 13 is a cross-sectional view of a semiconductor light-emitting element 100*c* according to a fourth exemplary embodiment of the present invention. FIG. 14 illustrates the configuration of each layer included in the semiconductor light-emitting element 100*c*. In FIG. 14, the Al composition ratio, the thickness, and a dopant in each of the layers constituting the semiconductor light-emitting element 100*c* are shown. In FIG. 14, the thicknesses are shown in multiples of a reference wavelength $\lambda$.

The semiconductor light-emitting element 100*c* according to the fourth exemplary embodiment constitutes a thyristor-type light-emitting diode including semiconductor layers having a p-n-p-n structure. The configuration of the semiconductor light-emitting element 100*c* will be described below.

The semiconductor light-emitting element 100*c* has a p-type substrate 134 composed of GaAs. A p-type buffer layer (not shown in FIG. 13) composed of Zn-doped GaAs is provided on the substrate 134. The buffer layer is provided for alleviating a lattice mismatch between the substrate 134 and a DBR 136 so as to improve crystallizability.

A p-type DBR 136 is provided on the buffer layer. The DBR 136 is a multilayer reflector formed by alternately and repeatedly stacking two kinds of semiconductor layers both having a thickness of 0.25, but having different refractive indices. Specifically, the DBR 136 is formed by alternately and repeatedly stacking p-type low refractive-index layers composed of Zn-doped $Al_{0.9}Ga_{0.1}As$ and p-type high refractive-index layers composed of Zn-doped $Al_{0.3}Ga_{0.7}As$. In the fourth exemplary embodiment, the total number of high refractive-index layers is 10, whereas the total number of low refractive-index layers is 11. By giving the DBR 136 this configuration, a reflective surface formed at an interface between the DBR 136 and a light-emitting layer 138 achieves maximum reflectivity against light with a wavelength $\lambda$ ($\lambda_0$).

The light-emitting layer 138 is provided on the DBR 136. The light-emitting layer 138 is formed by stacking a 1.25$\lambda$-thick n-type barrier layer 138a composed of Si-doped $Al_{0.3}Ga_{0.7}As$, a 1.00$\lambda$-thick active layer 138b composed of non-doped $Al_{0.14}Ga_{0.86}As$, and a 1.25$\lambda$-thick p-type barrier layer 138c composed of Zn-doped $Al_{0.3}Ga_{0.7}As$ in that order from the DBR 136 side. Accordingly, the light-emitting layer 138 has a double hetero-structure in which the active layer 138b, which has a relatively small band gap, is interposed between the n-type barrier layer 138a and the p-type barrier layer 138c, which have relatively large band gaps. By setting the Al composition of the active layer 138b in the above-described manner, the light emitted from the active layer 138b has a peak wavelength (i.e., a peak wavelength $\lambda_0$ of a spontaneous emission spectrum) of about 780 nm. In the fourth exemplary embodiment, the p-type barrier layer 138c also functions as a thyristor gate layer having the aforementioned p-n-p-n structure.

A 2.10$\lambda$-thick n-type cladding layer 140 composed of Si-doped $Al_{0.3}Ga_{0.7}As$ is provided on the light-emitting layer 138. Furthermore, a 0.15$\lambda$-thick n-type contact layer 142 composed of Si-doped GaAs is provided on the cladding layer 140.

A 1.25$\lambda$-thick insulator layer 144 composed of an insulating material having an intermediate refractive index between the refractive index (about 3.6) of the contact layer 142 and the refractive index (about 1.0) of air is provided on the contact layer 142. In the fourth exemplary embodiment, the insulator layer 144 is composed of $SiN_x$. The insulator layer 144 functions as an antireflection layer that reduces the reflectivity at a light extraction surface by alleviating the refractive-index difference between the semiconductor layers and the air. Thus, the light extraction efficiency in the semiconductor light-emitting element 100c is improved.

A cathode electrode 146 is provided on the contact layer 142. On the other hand, the surface of the substrate 134 is provided with an anode electrode 132. Furthermore, the semiconductor light-emitting element 100c according to the fourth exemplary embodiment is provided with a gate electrode 148 on the surface of the p-type barrier layer 138c serving as a gate layer that is exposed by partially removing the contact layer 142 and the cladding layer 140. The cathode electrode 146, the anode electrode 132, and the gate electrode 148 are composed of a material that is capable of forming an ohmic contact with the semiconductor layers in contact therewith. Specific examples of the material include gold (Au), an alloy of gold and germanium (AuGe), an alloy of gold and zinc (AuZn), and nickel (Ni).

In the semiconductor light-emitting element 100c having the above-described configuration, a lower reflective surface R2 is formed at the interface between the light-emitting layer 138 and the DBR 136, and an upper reflective surface R1 is formed at the interface between the contact layer 142 and the insulator layer 144, whereby a resonant-cavity light-emitting diode (RCLED) is formed. In the semiconductor light-emitting element 100c according to the fourth exemplary embodiment, the distance L between the upper reflective surface R1 and the lower reflective surface R2 (i.e., the total thickness of the light-emitting layer 138, the cladding layer 140, and the contact layer 142) is set to 5.75$\lambda$, which satisfies the aforementioned expression (1). Moreover, the thickness $t_i$ of the insulator layer 144 is set to 1.25$\lambda$, which satisfies the aforementioned expression (2). Consequently, a semiconductor light-emitting element, a light-source head, and an image forming apparatus are provided in which a change in the optical power relative to a thickness variation of the semiconductor layers or a change in the ambient temperature as well as an uneven change in the optical power relative to a change in the ambient temperature may be suppressed, as compared with those in the related art.

Fifth Exemplary Embodiment

Figure 15:
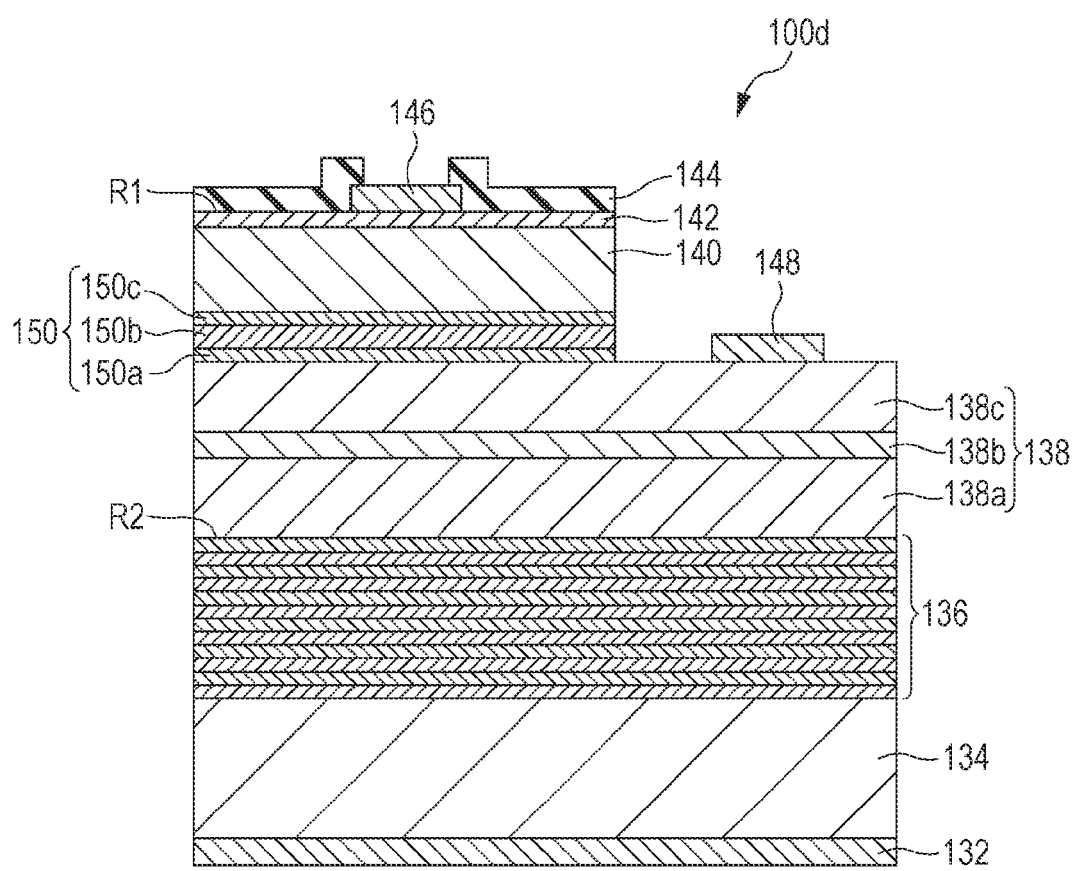
FIG. 15 is a cross-sectional view illustrating the configuration of a semiconductor light-emitting element according to a fifth exemplary embodiment of the present invention.

FIG. 15 is a cross-sectional view of a semiconductor light-emitting element 100d according to a fifth exemplary embodiment of the present invention. FIG. 16 illustrates the configuration of each layer included in the semiconductor light-emitting element 100d. In FIG. 16, the Al composition ratio, the thickness, and a dopant in each of the layers constituting the semiconductor light-emitting element 100d are shown. In FIG. 16, the thicknesses are shown in multiples of a reference wavelength $\lambda$.

The semiconductor light-emitting element 100d constitutes a thyristor-type light-emitting diode including semiconductor layers having a p-n-p-n structure. The semiconductor light-emitting element 100d according to the fifth exemplary embodiment of the present invention differs from the semiconductor light-emitting element 100c according to the fourth exemplary embodiment in that a phase shift layer 150 is provided between the p-type barrier layer 138c constituting the light-emitting layer 138 and the cladding layer 140 and in that the cladding layer 140 has a thickness of 1.1$\lambda$. Other configurations are the same as those in the semiconductor light-emitting element 100c according to the fourth exemplary embodiment.

The phase shift layer 150 has a three-layer structure including 0.25$\lambda$-thick low refractive-index layers 150a and 150c composed of Si-doped $Al_{0.9}Ga_{0.1}As$ and a 0.5$\lambda$-thick high refractive-index layer 150b composed of Si-doped $Al_{0.3}Ga_{0.7}As$ interposed therebetween. With this multilayer structure, the phase shift layer 150 has a function that causes multiple standing waves with different phases to occur within the semiconductor layers.

In the semiconductor light-emitting element 100d having the above-described configuration, a lower reflective surface R2 is formed at the interface between the light-emitting layer 138 and the DBR 136, and an upper reflective surface R1 is formed at the interface between the contact layer 142 and the insulator layer 144, whereby a resonant-cavity light-emitting diode (RCLED) is formed. In the semiconductor light-emitting element 100d according to the fifth exemplary embodiment, the distance L between the upper reflective surface R1 and the lower reflective surface R2 (i.e., the total thickness of the light-emitting layer 138, the phase shift layer 150, the cladding layer 140, and the contact layer 142) is set to 5.75$\lambda$, which satisfies the aforementioned expression (1). Moreover, the thickness $t_i$ of the insulator layer 144 is set to 1.25$\lambda$, which satisfies the aforementioned expression (2). Consequently, a semiconductor light-emitting element, a light-source head, and an image forming apparatus are provided in which a change in the optical power relative to a thickness variation of the semiconductor layers or a change in the ambient temperature as well as an uneven change in the optical power relative to a change in the ambient temperature may be suppressed, as compared with those in the related art.

The configurations of the semiconductor light-emitting elements according to the above exemplary embodiments may be combined. Furthermore, although each of the above exemplary embodiments is directed to a light-emitting element including an AlGaAs-based semiconductor, the above exemplary embodiments may alternatively be directed to a light-emitting element including a GaAs-based, GaP-based, or GaAsP-based semiconductor, an InGaAsP-based semiconductor, an AlGaInP-based semiconductor, or an InGaN-based semiconductor.

Furthermore, in each of the above exemplary embodiments, the distance L between the upper reflective surface R1 and the lower reflective surface R2 is set to a value that is shifted by 0.25λ from an integral multiple (0.5aλ) of 0.5λ, which satisfies the resonant condition relative to the peak wavelength $\lambda_0$ of the spontaneous emission spectrum, as shown in the aforementioned expression (1). However, even if the shift amount from the resonant condition deviates from 0.25λ by ±0.05λ, there is substantially no effect on the function of the semiconductor light-emitting element according to each exemplary embodiment.

Figure 17A:
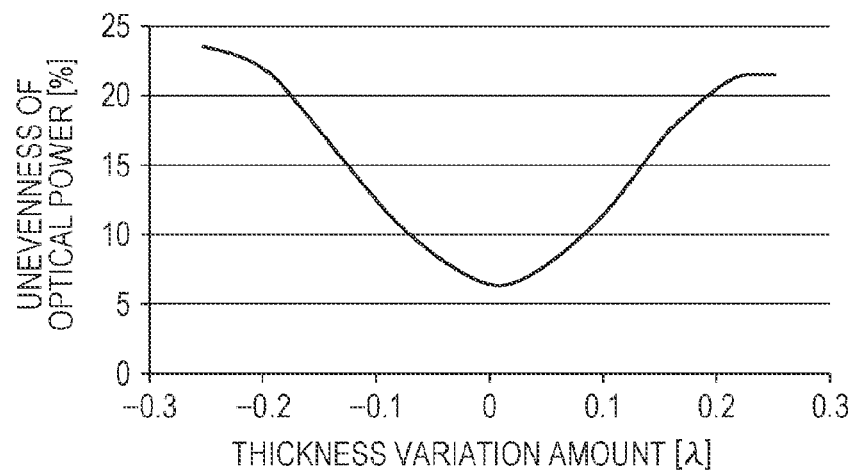
FIG. 17A illustrates the relationship between a distance L between an upper reflective surface and a lower reflective surface and an uneven optical power.

FIG. 17A illustrates a simulation result showing an uneven optical power when the insulator layer functioning as an antireflection layer is composed of $SiO_2$ and the distance L between the upper reflective surface R1 and the lower reflective surface R2 varies from the state where the distance L satisfies expression (1). In FIG. 17A, the horizontal axis denotes an amount of change in the distance L from expression (1). In other words, the value "0" on the horizontal axis corresponds to a state where the distance L between the upper reflective surface R1 and the lower reflective surface R2 satisfies the aforementioned expression (1) and the shift amount from the resonant condition is equal to 0.25λ. In FIG. 17A, an amount of change of ±0.25λ in thickness corresponds to the semiconductor light-emitting element according to the comparative example described above. The vertical axis in FIG. 17A denotes a percentage for an average optical power of a difference between maximum and minimum optical power values in a range in which the thickness of the semiconductor layers varies within ±2.5%, as shown in FIG. 17B.

Figure 17B:
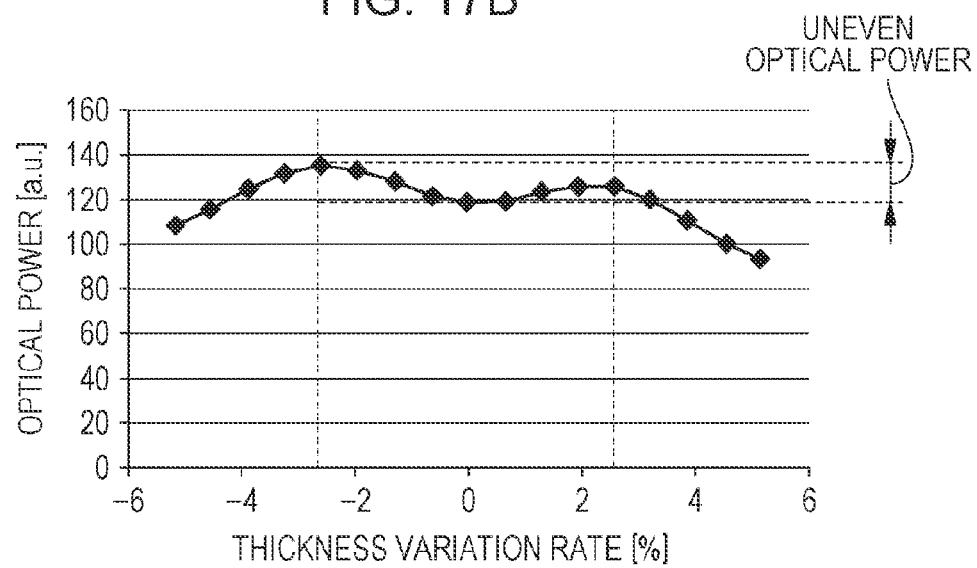
FIG. 17B is a diagram explaining a method for calculating the uneven optical power in FIG. 17A.

As shown in FIGS. 17A and 17B, when the distance L between the upper reflective surface R1 and the lower reflective surface R2 varies by ±0.25λ (which corresponds to the semiconductor light-emitting element according to the comparative example) from the state where the distance L satisfies expression (1), the optical power varies by 20% or higher. In contrast, when the distance L between the upper reflective surface R1 and the lower reflective surface R2 satisfies expression (1) (which corresponds to the semiconductor light-emitting element according to each of the exemplary embodiments of the present invention), the optical power varies by 6.4%, which is one-third or less of the above value. However, it is conceivable that there is no adverse effect in terms of practical usage by minimizing the unevenness of the optical power to 10% or lower in the above evaluation. Since the optical power varies by 8.9% or lower even if the distance L between the upper reflective surface R1 and the lower reflective surface R2 varies by ±0.05λ from the state where the distance L satisfies expression (1), a variation of ±0.05λ from the state where the distance L satisfies expression (1) is permissible. Accordingly, the distance L between the upper reflective surface R1 and the lower reflective surface R2 may be set within the following range.

$$0.20\lambda+0.5a\lambda \leq L \leq 0.30\lambda+0.5a\lambda \text{ (}a\text{ being an arbitrary positive integer)}$$

Furthermore, in each of the above exemplary embodiments, the thickness $t_i$ of the insulator layer functioning as an antireflection layer is set to a value that is shifted by 0.25λ from an integral multiple (0.5bλ) of 0.5λ, as shown in the aforementioned expression (2). However, even if the shift amount deviates from 0.25λ by ±0.1λ, there is substantially no effect on the function of the semiconductor light-emitting element according to each exemplary embodiment. Therefore, the thickness $t_i$ of the insulator layer may be set within the following range.

$$0.15\lambda+0.5b\lambda \leq t_i \leq 0.35\lambda+0.5b\lambda \text{ (}a\text{ being an arbitrary positive integer)}$$

Furthermore, although the insulator layer functioning as an antireflection layer is formed of an $SiO_2$ film, an $SiN_x$ film or a multilayer film constituted of these films in each of the above exemplary embodiments, an alternative insulating material having a refractive index ranging between 1.4 and 3 may be used. In order to enhance the antireflection function of the insulator layer, the refractive index of the insulator layer may substantially range between 1.8 and 2.2. In order to achieve an effect equivalent to that of $SiO_2$, the refractive index may be 1.45. In order to achieve an effect equivalent to that of $SiN_x$, the refractive index may range between 1.8 and 2.2. Candidate materials include $CeO_2$, $HfO_2$, $La_2O_3$, $Ta_2O_5$, $Y_2O_3$, ZnO, and ZrO.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A semiconductor light-emitting element comprising:
    a semiconductor layer that includes a light-emitting layer; and
    an upper reflective surface and a lower reflective surface between which the semiconductor layer is interposed,
        wherein a distance L between the upper reflective surface and the lower reflective surface satisfies $0.20\lambda+0.5a\lambda \leq L \leq 0.30\lambda+0.5a\lambda$, where λ denotes a peak wavelength of light emitted from the light-emitting layer within the semiconductor layer, and a denotes an arbitrary positive integer.

2. The semiconductor light-emitting element according to claim 1, further comprising an insulator layer that is provided at a surface of the semiconductor layer and that has an intermediate refractive index between a refractive index of the semiconductor layer and a refractive index of air,
    wherein the upper reflective surface is formed at an interface between the semiconductor layer and the insulator layer.

3. The semiconductor light-emitting element according to claim 2, wherein a thickness $t_i$ of the insulator layer satisfies $0.15\lambda+0.5b\lambda \leq t_i \leq 0.35\lambda+0.5b\lambda$, where b denotes an arbitrary positive integer.

4. The semiconductor light-emitting element according to claim 2, wherein the insulator layer includes a first insulator layer and a second insulator layer, the first insulator layer being in contact with the semiconductor layer and having a relatively high refractive index, the second insulator layer being provided on the first insulator layer and having a relatively low refractive index.

5. The semiconductor light-emitting element according to claim 4, wherein the second insulator layer has a thickness that is larger than a thickness of the first insulator layer.

6. The semiconductor light-emitting element according to claim 2, wherein the semiconductor layer includes $Al_xGa_{1-x}As$, and wherein the insulator layer is composed of a material having a refractive index substantially ranging between 1.8 and 2.2.

7. The semiconductor light-emitting element according to claim 1, further comprising a multilayer reflector that is formed by stacking a plurality of layers having different refractive indices and that is in contact with the semiconductor layer, wherein the lower reflective surface is formed at an interface between the semiconductor layer and the multilayer reflector.

8. A light-source head comprising:

a light-emitting-element array that includes a plurality of the semiconductor light-emitting elements according to claim 1; and an optical system that focuses light emitted from each semiconductor light-emitting element onto an exposure surface.

9. An image forming apparatus comprising:

the light-source head according to claim 8;

a photoconductor that has a surface on which an electrostatic latent image is formed by light emitted from the light-source head;

a developing section that develops the electrostatic latent image formed on the photoconductor so as to form a toner image; and a transfer section that transfers the toner image formed on the photoconductor onto a recording medium.

* * * * *